United States Patent
Park

(10) Patent No.: US 9,912,287 B2
(45) Date of Patent: Mar. 6, 2018

(54) SOLAR CELL MODULE AND METHOD OF FABRICATING THE SAME

(71) Applicant: LG INNOTEK CO., LTD., Seoul (KR)

(72) Inventor: Chi Hong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/360,894

(22) PCT Filed: Nov. 23, 2012

(86) PCT No.: PCT/KR2012/009990
§ 371 (c)(1),
(2) Date: May 27, 2014

(87) PCT Pub. No.: WO2013/077674
PCT Pub. Date: May 30, 2013

(65) Prior Publication Data
US 2014/0338731 A1    Nov. 20, 2014

(30) Foreign Application Priority Data

Nov. 25, 2011 (KR) .................. 10-2011-0124626
Dec. 9, 2011 (KR) .................. 10-2011-0132368

(51) Int. Cl.
*H02S 40/34* (2014.01)
*H02S 30/10* (2014.01)
(Continued)

(52) U.S. Cl.
CPC .......... *H02S 40/34* (2014.12); *H01L 31/0201* (2013.01); *H02S 20/26* (2014.12); *H02S 30/10* (2014.12); *Y02B 10/10* (2013.01)

(58) Field of Classification Search
CPC .......... H02S 20/00; H02S 20/10–20/32; H02S 30/10; H02S 40/34; H01L 31/02021
(Continued)

(56) References Cited

U.S. PATENT DOCUMENTS 5,280,133 A    1/1994  Nath
6,066,797 A *  5/2000  Toyomura et al. .......... 136/251
(Continued)

FOREIGN PATENT DOCUMENTS

CN    201121386 Y    9/2008
CN    201408767 Y    2/2010
(Continued)

OTHER PUBLICATIONS

International Search Report in International Application No. PCT/KR2012/009990, filed Nov. 23, 2012.
(Continued)

*Primary Examiner* — Niki Bakhtiari
(74) *Attorney, Agent, or Firm* — Saliwanchik, Lloyd & Eisenschenk

(57) ABSTRACT

A solar cell module according to the embodiment includes a support substrate having a single hole at a peripheral region of the support substrate; solar cells at an upper portion of the support substrate; a bus bar electrically connected to the solar cells; and a junction box connected to the bus bar, wherein the junction box includes an insertion part partially inserted in the single hole.

10 Claims, 4 Drawing Sheets

(51) Int. Cl.
*H01L 31/02* (2006.01)
*H02S 20/26* (2014.01)

(58) Field of Classification Search
USPC .................................................. 136/243–265
See application file for complete search history.

(56) References Cited

U.S. PATENT DOCUMENTS

| | | | |
|---|---|---|---|
| 6,331,671 | B1 | 12/2001 | Makita et al. |
| 2003/0079772 | A1 | 5/2003 | Gittings et al. |
| 2007/0056625 | A1 | 3/2007 | Higuchi et al. |
| 2008/0000517 | A1* | 1/2008 | Gonsiorawski ... B32B 17/10018 136/246 |
| 2009/0114261 | A1* | 5/2009 | Stancel .................. H01L 31/05 136/244 |
| 2009/0114262 | A1* | 5/2009 | Adriani et al. ............... 136/244 |
| 2011/0079284 | A1 | 4/2011 | Wu |
| 2011/0259403 | A1 | 10/2011 | Myong et al. |
| 2012/0152325 | A1* | 6/2012 | Podkin .................. H01L 31/048 136/251 |
| 2012/0174958 | A1 | 7/2012 | Park |

FOREIGN PATENT DOCUMENTS

| | | |
|---|---|---|
| CN | 102237440 A | 11/2011 |
| DE | 102006019210 A1 | 10/2007 |
| JP | 2001-339088 A | 12/2001 |
| KR | 10-2001-0021238 A | 3/2001 |
| KR | 20-2009-0003860 U | 4/2009 |
| KR | 10-2011-0035788 A | 4/2011 |
| TW | 201114049 A | 4/2011 |
| WO | WO-2009029897 A2 | 3/2009 |

OTHER PUBLICATIONS

Office Action dated Jan. 21, 2016 in Chinese Application No. 201280068132.7.

Office Action dated Jun. 24, 2016 in Chinese Application No. 201280068132.7.

Office Action dated Jul. 12, 2017 in U.S. Appl. No. 14/958,344.

* cited by examiner

[Fig. 1]
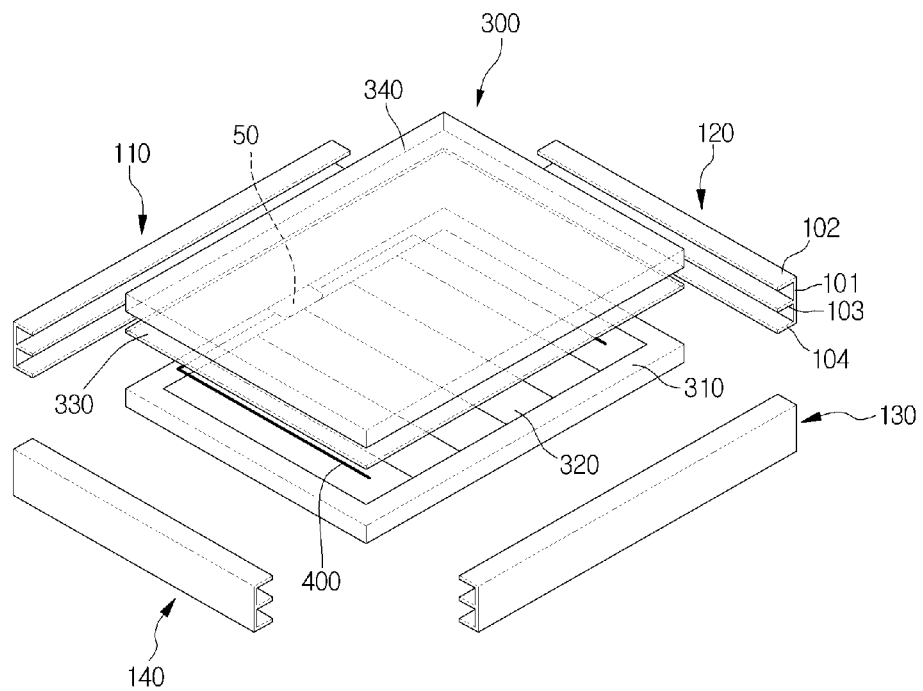
[Fig. 2]
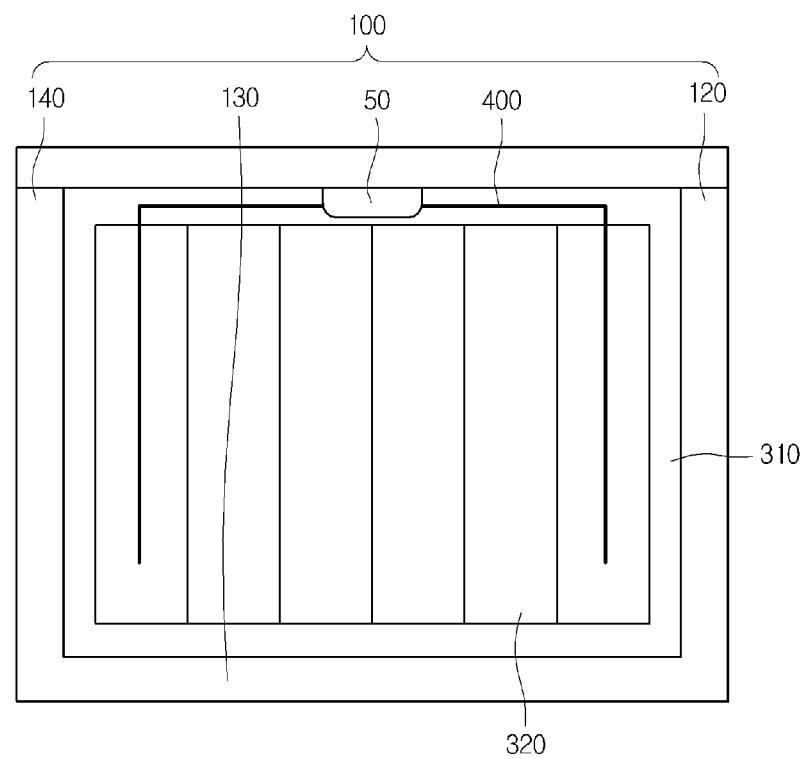

[Fig. 3]
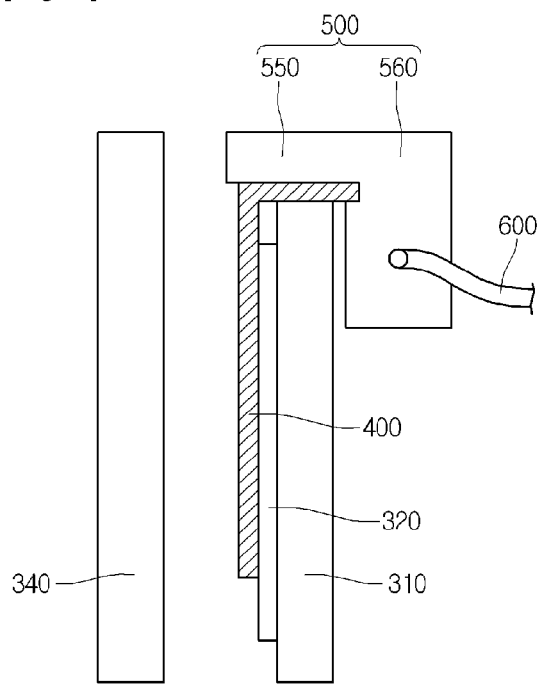
[Fig. 4]
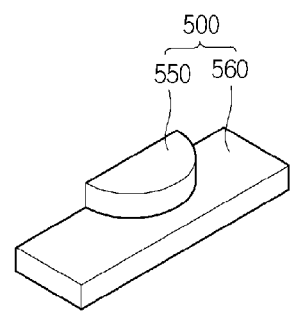
[Fig. 5]
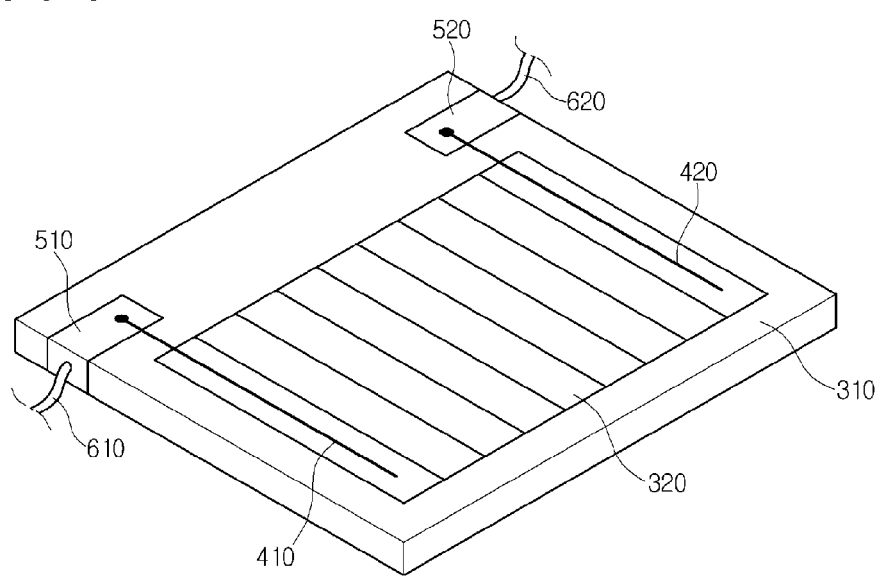

[Fig. 6]
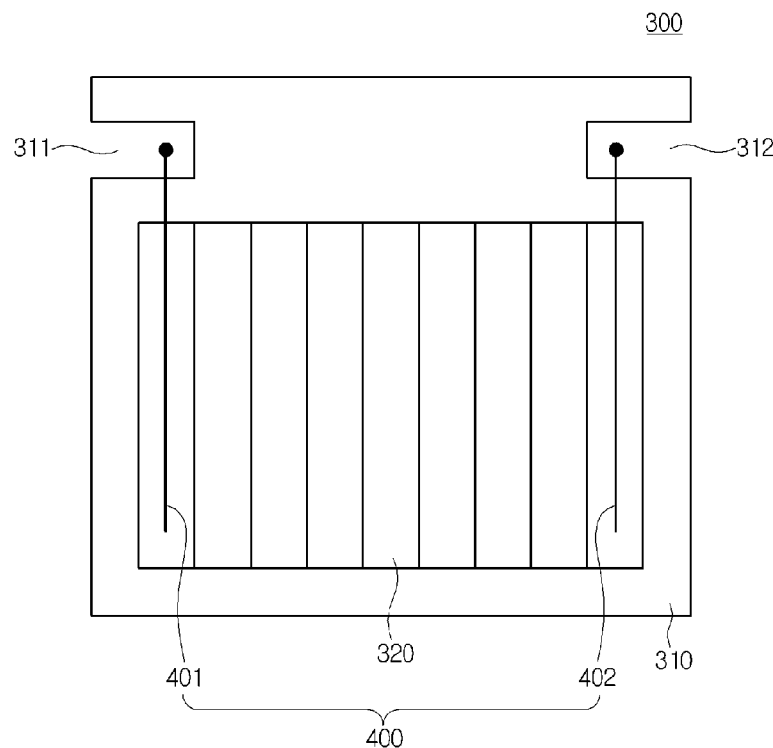
[Fig. 7]
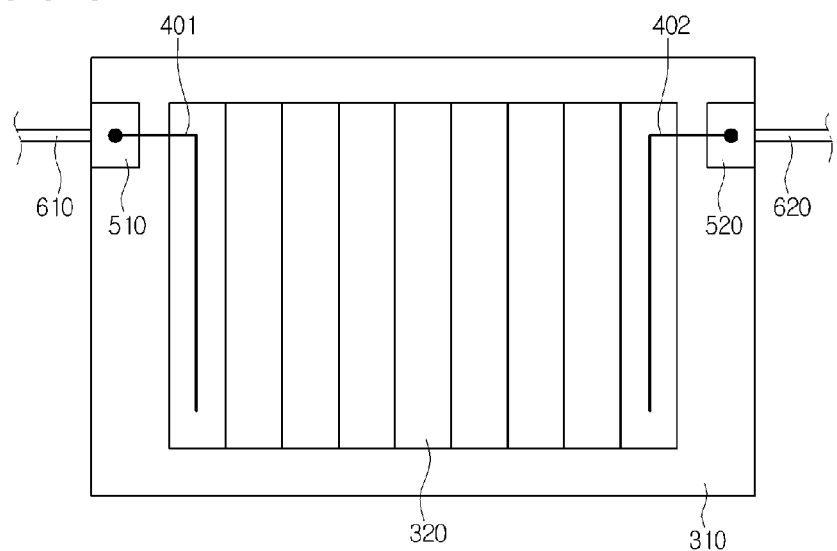
[Fig. 8]
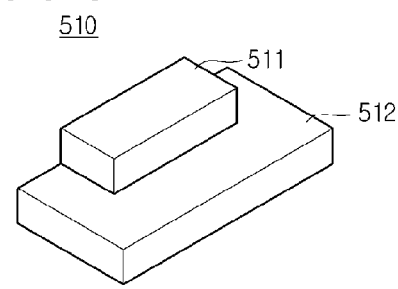

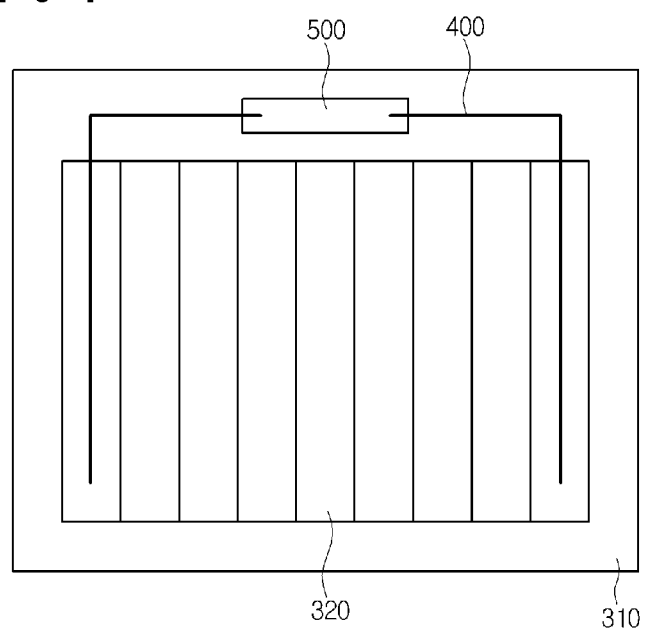
[Fig. 9]

SOLAR CELL MODULE AND METHOD OF FABRICATING THE SAME

CROSS-REFERENCE TO RELATED APPLICATIONS

This application is the U.S. national stage application of International Patent Application No. PCT/KR2012/009990, filed Nov. 23, 2012, which claims priority to Korean Application Nos. 10-2011-0124626, filed Nov. 25, 2011, and 10-2011-0132368, filed Dec. 9, 2011 the disclosures of each of which are incorporated herein by reference in their entirety.

TECHNICAL FIELD

The embodiment relates to a solar cell module and a method of fabricating the same, and more particularly, to a solar cell module capable of improving the reliability and productivity and a method of fabricating the same.

BACKGROUND ART

Recently, as the lack of an energy resource such as petroleum or coal is expected, the interest in the substitute energy has been more increased. In this regard, a solar cell converting solar energy into electric energy is spotlighted.

A solar cell (or photovoltaic cell) is a core element in solar power generation to directly convert solar light into electricity.

For example, if the solar light having energy greater than bandgap energy of a semi-conductor is incident into a solar cell having the PN junction structure, electron-hole pairs are generated. As electrons and holes are collected into an N layer and a P layer, respectively, due to the electric field formed in a PN junction part, photovoltage is generated between the N and P layers. In this case, if a load is connected to electrodes provided at both ends of the solar cell, current flows through the solar cell.

Current generated from the solar cell is transferred to a junction box through a bus bar. In general, when the bus bar formed at a top surface of a solar cell panel is connected to the junction box formed at a bottom surface of a lower substrate, the bus bar may be partially exposed to the outside so that the reliability may be reduced.

When the junction box is formed at the bottom surface of the lower substrate, because a junction area between the lower substrate and the junction box is not wide, the lower substrate and the junction box may be separated from each other due to external pressure so that it is necessary to reinforce a bonding strength between the lower substrate and the junction box.

DISCLOSURE OF INVENTION

Technical Problem

The embodiment provides a solar cell module and a method of fabricating the same.

Solution to Problem

According to the embodiment, there is provided a solar cell module including: a support substrate having a single hole at a peripheral region of the support substrate; solar cells at an upper portion of the support substrate; a bus bar electrically connected to the solar cells; and a junction box connected to the bus bar, wherein the junction box includes an insertion part partially inserted in the single hole.

Advantageous Effects of Invention

In the solar cell module according to the embodiment, since the single hole is formed at the peripheral region of the support substrate, the junction box fills the single hole and makes contact with the bus bar, so the bus bar may be coupled with the junction box without being exposed to the outside so that the reliability of devices can be improved.

Further, since the single hole is formed at the support substrate to connect a bus bar serving as an anode to the junction box, structural stress of the support substrate due to the formation of the single hole can be attenuated.

Since a protrusion is inserted and coupled so that the junction box fills the hole formed at the lower substrate, the structure of the solar cell module can be securely supported.

Meanwhile, when a groove is formed, a failure rate occurring during a process of forming the hole at the support substrate can be reduced.

BRIEF DESCRIPTION OF DRAWINGS

FIG. 1 is a perspective view showing a solar cell module according to the first embodiment;

FIG. 2 is a top view showing the solar cell module of FIG. 1;

FIG. 3 is a sectional view showing the solar cell module of FIG. 1;

FIG. 4 is a perspective view showing a junction box of FIG. 1;

FIG. 5 is a perspective view showing a solar cell module according to the second embodiment;

FIG. 6 is a top view showing a solar cell module according to the embodiment;

FIG. 7 is a top view showing a solar cell module according to the third embodiment;

FIG. 8 is a perspective view showing a junction box of FIGS. 5; and

FIG. 9 is a top view showing the junction box of FIGS. 5 and 7.

BEST MODE FOR CARRYING OUT THE INVENTION

In the description of the embodiments, it will be understood that when a panel, a bar, a frame, a substrate, a hole, or a film, is referred to as being on or under another panel, another bar, another frame, another substrate, another hole, or another film, it can be directly or indirectly on the other panel, the other bar, the other frame, the other substrate, the other hole, the other film, or one or more intervening layers may also be present. Such a position of the layer has been described with reference to the drawings. The size of the elements shown in the drawings may be exaggerated for the purpose of explanation and may not utterly reflect the actual size.

FIG. 1 is a perspective view showing a solar cell module according to the first embodiment. FIG. 2 is a top view showing the solar cell module of FIG. 1. FIG. 3 is a sectional view showing the solar cell module of FIG. 1. FIG. 4 is a perspective view showing a junction box of FIG. 1.

The solar cell module according to the embodiment includes solar cells 320, a support substrate 310 supporting the solar cells 320, a single hole 50 formed at a peripheral region of the support substrate 310, a bus bar 400 electrically connected to the solar cells 320, and a junction box 500 connected to the bus bar 400, and the junction box 500 is partially formed in the single hole 50 of the support substrate 310.

The support substrate 310 may be an insulator. The support substrate 310 may be a glass substrate, a plastic substrate or a metal substrate. In detail, the lower substrate 310 may be a soda lime glass substrate. The support substrate 310 may be transparent. The support substrate 310 may be rigid or flexible.

The solar cells 320 may be formed on the support substrate 310 and have a plate shape. For example, the solar cells 320 may have a square plate shape. The solar cells 320 receive solar light and convert the solar light into electric energy.

Frames 110, 120, 130, and 140 may be formed at sides of the solar cells 320 to receive the solar cells 320, respectively. For example, the frames 110, 120, 130, and 140 may be disposed at four sides of the solar cells 320, respectively. For example, a material used for the frames 110, 120, 130, and 140 may include metal such as aluminum.

A protective layer 330 protecting the solar cells 320 and an upper substrate 340 disposed on the protective layer 330 may be formed at upper portions of the solar cells 320, respectively, and these components are integrally formed with each other through a lamination process.

The upper substrate 340 and the support substrate 310 protect the solar cells 320 from an external environment. The upper substrate 340 and the support substrate 310 may have a multi-layer structure including a layer for preventing moisture and oxygen from being infiltrated, a layer for preventing chemical corrosion, and a layer having insulation characteristics.

The protective layer 330 is integrated with the solar cells 320 through a lamination process in a state that is disposed at upper portions of the solar cells 320, and prevents corrosion due to infiltration of moisture and protects the solar cells 320 from impact. The protective layer 330 may include a material such as ethylene vinyl acetate (EVA). The protective layer 330 may be further formed at lower portions of the solar cells 320.

The upper substrate 340 may be formed on the protective layer 330. The upper substrate 340 includes tempered glass representing high transmittance rate and a superior damage preventing function. In this case, the tempered glass may include low-iron tempered glass. To improve a scattering effect of light, an inner side of the upper substrate 340 may be embossed.

A bus bar 400 is connected to the solar cells 320. For example, the bus bar 400 is disposed on top surfaces of outermost solar cells 320. The bus bar 400 may make direct contact with the top surfaces of the outermost solar cells 320. A bus bar formed at one end of the solar cells 320 and a bus bar formed at an opposite end of the solar cells 320 may have mutually different polarities. For example, when the bus bar formed at the one end of the solar cells 320 acts as an anode, the bus bar formed at the opposite end of the solar cells 320 may act as a cathode.

The bus bar 400 may extend downward through a hole 50 which is formed at a peripheral region of the support substrate 310. The hole 50 is prepared as a single hole, and the bus bars 400 formed at both ends of the single hole 50 extend laterally and then downward along the support substrate 310 through the peripheral region of the hole 50. The hole 50 is formed at a transverse side of the support substrate 310 in the drawing, but may be formed at a longitudinal side of the support substrate 310.

The hole 50 may be formed at an edge of the support substrate 310. In detail, the hole 50 is formed through the support substrate and makes contact with the corner of the support substrate 310. Accordingly, when the hole 50 has a spherical shape, as shown in FIG. 2, a section of the hole 50 has a square shape and a peripheral region of the hole 50 is rounded.

The solar cells 320 have a width less than that of the support substrate 310. Since the hole 50 is formed at a peripheral region of the support substrate 310 in which the solar cells 320 are not formed, a light receiving area may be ensured.

The junction box 500 is electrically connected to the solar cells 320 through the bus bar 400. The junction box 500 may include an insertion part 550 partially inserted in the hole 50 which is formed at the peripheral region of the support substrate 310 and a support part 560 supporting the insertion part 550 at a lower portion of the insertion part 550.

The insertion part 550 of the junction box 500 may have an area corresponding to the hole 50.

In detail, the bus bar 400 extends to the hole 50 and is inserted into the hole 50, and the bus bar 400 is bent and makes the junction box 500 which is formed at the lower portion of the support substrate 310.

The bus bar 400 may be inserted into the hole 50 along a peripheral region of the hole 50. In detail, the bus bar 400 may be inserted into the hole 50 along a surface making contact with the support substrate 310 among surfaces formed by the hole 50.

The junction box 500 includes an insertion part 550 inserted into the hole 50 and a support part 560 supporting the insertion part 550, and the insertion part 550 has a shape corresponding to the hole 50.

The bus bar 400 may be connected to the junction box 500 through a top surface of the support part 560, that is, the top surface of the support part 560 making contact with a bottom surface of the support substrate 310. The bus bar 400 may be bent and extend from top surfaces of the solar cells 320 to the hole 50.

The junction box 500 includes a bypass diode and may receive a circuit board which is connected to the bus bar 400 and a cable 600. The cable 600 is connected to the circuit board, and is electrically connected to the solar cells 320 through the junction box 500.

Generally, to connect bus bars acting as an anode and a cathode to a junction box formed at a bottom surface of the support substrate 310, respectively, a hole is formed at one surface of the support substrate 310, and the bus bars are electrically connected to the junction box 500 through the hole. Since the junction box 500 is bonded to a bottom surface of the support substrate by a bonding area so that it is necessary to reinforce a bonding strength between the lower substrate the junction box.

In the embodiment, the hole 50 is formed at an edge of the support substrate 310, and the bus bar 400 is bent through the hole 50 to make contact with the junction box 500. Since the insertion part 550 of the junction box 500 fills the hole 50, the bus bar 400 is not exposed to the outside through the insertion part 550 so that the reliability can be improved.

A bonding area between the junction box 500 and the support substrate 310 may be increased and the junction box 500 may be firmly coupled with the support substrate 310 by the insertion part 550, thereby preventing the junction box 500 from being separated from the support substrate 310 due to external pressure.

FIG. 4 is a perspective view showing a junction box according to the embodiment. As shown in FIG. 4, the junction box 500 may include a support portion 560 and an insertion part 550.

The insertion part 550 is inserted into the hole 50, and the support part 560 supports the insertion part 550 and is formed at a bottom surface of the support substrate 310. The support part 560 may have a sectional area wider than a sectional area of the insertion part 550.

The insertion part 550 may be formed at the same height as that of the support part 560, and may be formed at the same height as that of the support substrate 310.

Hereinafter, another embodiment of a solar cell module will be described with reference to FIGS. 5 to 8.

FIG. 5 is a perspective view showing a solar cell module according to the second embodiment. FIG. 6 is a top view showing a solar cell module of FIG. 5.

Referring to FIGS. 5 and 6, the solar cell module according to the embodiment includes solar cells 320, a support substrate 310 supporting the solar cells 320, a bus bar 400 electrically connected to the solar cells 320, and a junction box 500 connected to the bus bar 400, and the junction box 500 is mounted in a side of the support substrate 310.

The support substrate 310 may be an insulator. The support substrate 310 may be a glass substrate, a plastic substrate or a metal substrate. In detail, the support substrate 310 may be a soda lime glass substrate. The support substrate 310 may be transparent. The support substrate 310 may be rigid or flexible.

The solar cells 320 may be formed on the support substrate 310 and have a plate shape. For example, the solar cells 320 may have a square plate shape. The solar cells 320 receive solar light and convert the solar light into electric energy.

Frames (not shown) may be formed at sides of the solar cells 320 to receive the solar cells 320, respectively. For example, the frames may be disposed at four sides of the solar cells 320, respectively. For example, a material used for the frames may include metal such as aluminum.

A protective layer (not shown) protecting the solar cells 320 and an upper substrate (not shown) disposed on the protective layer may be formed at upper portions of the solar cells 320, respectively, and these components are integrally formed with each other through a lamination process.

The upper substrate and the support substrate 310 protect the solar cells 320 from an external environment. The upper substrate and the support substrate 310 may have a multi-layer structure including a layer for preventing moisture and oxygen from being infiltrated, a layer for preventing chemical corrosion, and a layer having insulation characteristics.

The protective layer is integrated with the solar cells 320 through a lamination process in a state that is disposed at upper portions of the solar cells 200, and prevents corrosion due to infiltration of moisture and protects the solar cells 320 from impact. The protective layer may include a material such as ethylene vinyl acetate (EVA). The protective layer may be further formed at lower portions of the solar cells 320.

An upper substrate may be formed on the protective layer. The upper substrate includes tempered glass representing high transmittance rate and a superior damage preventing function. In this case, the tempered glass may include low-iron tempered glass. To improve a scattering effect of light, an inner side of the upper substrate may be embossed.

The bus bar 400 is connected to the solar cells 320. For example, the bus bar 400 is disposed on top surfaces of outermost solar cells 320. The bus bar 400 makes direct contact with the top surfaces of the outermost solar cells 320. A bus bar 410 formed at one end of the solar cells 320 and a bus bar 420 formed at an opposite end of the solar cells 320 have mutually different polarities. For example, when the bus bar 410 formed at the one end of the solar cells 320 acts as an anode, the bus bar 420 formed at the opposite end of the solar cells 320 may act as a cathode.

A junction box 500 is electrically connected to the solar cells 320. The junction box 500 may be formed at a peripheral region of the support substrate 310, and is connected to the bus bars 401 and 402, respectively. In detail, the junction box 500 may be formed at both ends of the support substrate 310 to make contact with the bus bar 410 formed at the one end of the solar cells 320 and the bus bar 420 formed at the opposite end of the solar cells 320.

To this end, grooves 311 and 312 are formed at sides of the support substrate 310, respectively. The grooves 311 and 312 may be formed by processing a part of the support substrate 310, and are formed at a transverse side of the support substrate 310 in FIG. 6, but may be formed at a longitudinal side of the support substrate 310.

Since the solar cells 320 have a width less than that of the support substrate 310 and the grooves 311 and 312 are formed at a peripheral region of the support substrate 310 in which the solar cells 320 are not formed, a light receiving area may be ensured.

The junction box 500 may fill the holes 311 and 312, respectively. The junction box 500 may have an area corresponding to the grooves 311 and 312.

In detail, since the grooves 311 and 312 are formed at the sides of the support substrate 310 to have a " shape, the junction box 500 may have the " shape to fill the grooves 311 and 312.

Although a plurality of grooves are formed at both sides of the support substrate 310 in the embodiment, one groove may be formed at an upper center region of the support substrate 310 and the junction box 500 may fill the one groove.

The bus bars 401 and 402 acting as an anode and a cathode may be connected to the junction box 500, respectively.

For example, the junction box 500 includes a junction box 510 of an anode connected to the bus bar 410 acting as the anode and a junction box 520 of a cathode connected to the bus bar 420 acting as the cathode, and the junction box 510 of the anode and the junction box 520 of the cathode may be electrically connected to each other by the solar cells 320.

The side of the support substrate 310 may share the same straight line with sides of the junction boxes 510 and 520. That is, the junction boxes 510 and 520 may have the same area as areas of the grooves 311 and 312.

FIG. 7 is a top view showing a solar cell module according to third embodiment. The junction box 510 of the anode and the junction box 520 of the cathode are formed at sides of the solar cells 320, and the bus bars 401 and 402 are connected to the junction boxes 510 and 520, respectively. As described above, since the junction box 510 of the anode and the junction box 520 of the cathode are formed at sides of the solar cells 320, there is no need to reduce light receiving areas of the solar cells 320 to form the grooves 311 and 312 so that the light receiving areas can be ensured.

The junction box 500 includes a bypass diode and may receive a circuit board which is connected to the bus bar 400 and a cable 600. The solar cell module according to the embodiment may further include a wire which connects the bus bar 400 to a circuit board. The cable 600 is connected to the circuit board, and is connected to the solar cells 320 through a connector 515 of the junction box 500.

Cables 610 and 620 may be connected to sides of the junction boxes 510 and 520, respectively.

Generally, to connect bus bars acting as an anode and a cathode to a junction box formed at a bottom surface of the support substrate 310, respectively, a hole is formed at the support substrate 310. Since the number of processes is increased in the procedure and the support substrate is damaged during a procedure of forming the hole, the reliability and the productivity can be lowered.

In the embodiment, the groove is formed at the side of the support substrate 310 and the bus bar is connected to the junction box through the groove. Since the junction box has the size corresponding to the groove of the support substrate 310 and is disposed at the side of the support substrate 310, the hole is not formed in the support substrate and the junction box may be electrically connected to the bus bar, the reliability and the productivity can be improved.

FIG. 8 is a perspective view illustrating a junction box of FIGS. 5 and 7. For example, FIG. 8 illustrates a junction box 510 connected to an anode, but the junction box 510 may be connected to a cathode. As shown in FIG. 8, the junction box 510 may include a support part 512 and an insertion part 511.

The insertion part 511 is inserted into the groove 311, the support part 512 supports the insertion part 511 and is formed at a bottom surface of the support substrate 310. A section of the support part 512 may have an area wider than an area of a section of the insertion part 511 or the same area than that of the section of the insertion part 511.

FIG. 9 is a top view illustrating a solar cell module according to another embodiment. As shown in FIG. 9, the junction box 500 is completely inserted into a groove, so the groove is not formed at a side of the support substrate 310 but is formed inside the support substrate 310. In this case, the solar cell module is easily applicable to a Building Integrated Photovoltaic System (BIPV).

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising:
   a support substrate having a single hole at an edge of the support substrate;
   a plurality of solar cells at an upper portion of the support substrate;
   a protective layer on portions of the plurality of solar cells;
   an upper substrate on the protective layer;
   a bus bar electrically connected to the solar cells;
   a junction box connected to the bus bar;
   wherein the junction box comprises an insertion part inserted in the single hole and a support part supporting the insertion part;
   wherein the bus bar is in direct physical contact with a lateral surface of the insertion part and a top surface of the support part;
   wherein the upper substrate comprises low-iron tempered glass;
   wherein an inner side of the upper substrate is embossed and is in direct physical contact with the protective layer;
   wherein the bus bar is bent and extends from a top surface of the plurality of solar cells to the single hole:
   wherein the insertion part is in direct physical contact with an inner surface of the single hole;
   wherein the top surface of the support part is in direct physical contact with a bottom surface of the support substrate;
   wherein the insertion part is in direct physical contact with the bus bar in the single hole;
   wherein the bus bar is disposed between the insertion part and the support substrate in the single hole; and
   wherein the insertion part fills the single hole.

2. The solar cell module of claim 1, wherein the single hole has a rectangular sectional shape.

3. The solar cell module of claim 1, wherein an edge of the single hole is rounded.

4. The solar cell module of claim 1, wherein a side of the support substrate, in which the single hole is formed, shares a same straight line with a side of the insertion part.

5. The solar cell module of claim 1, wherein the insertion part has a shape corresponding to the single hole.

6. The solar cell module of claim 1, wherein the protective layer comprises ethylene vinyl acetate (EVA).

7. The solar cell module claim 1, wherein a combined width of the solar cells is less than a width of the support substrate.

8. The solar cell module of claim 1, wherein the bus bar is inserted into the single hole along a surface making contact with the support substrate among surfaces foinied by the single hole.

9. The solar cell module of claim 1, wherein the insertion part is formed at a same height as that of the support part.

10. The solar cell module of claim 1, wherein the insertion part is formed at a same height as that of the support substrate.

* * * * *